APPARATUS FOR PRINTED-CIRCUIT SOLDER COATING

Filed May 2, 1956 2 Sheets-Sheet 1

INVENTORS
FRANK A. TERMINI
JOSEPH M. RAFALKO
BY Henry Kolin
AGENT

APPARATUS FOR PRINTED-CIRCUIT SOLDER COATING

Filed May 2, 1956 2 Sheets-Sheet 2

INVENTORS
FRANK A. TERMINI
JOSEPH M. RAFALKO
BY Henry Kolin
AGENT

United States Patent Office 2,803,216
Patented Aug. 20, 1957

2,803,216

APPARATUS FOR PRINTED-CIRCUIT SOLDER COATING

Frank A. Termini, Astoria, N. Y., and Joseph M. Rafalko, Kearny, N. J., assignors to International Telephone and Telegraph Corporation, Nutley, N. J., a corporation of Maryland Application May 2, 1956, Serial No. 582,166

2 Claims. (Cl. 118—423)

This invention relates to an improved method of soldering and more particularly to a method for depositing a uniform coating of solder on a printed-circuit assembly.

Printed circuits are well known and have been utilized widely. They are particularly suitable for the mass production of electronic devices on an automatic basis. Various types of printed circuits are known, a common type consisting of a sheet of eletrical insulating material carrying on at least one face or surface thereof one or more electric conductors in the form of thin flat strips integrally united to the insulating material. Many methods have been proposed and used for attaching the electric conductor to the insulating sheet. These methods have varying degrees of utility, and the choice of a specific method is usually dependent upon the particular applications or requirements that are present. Several such methods have been described in the publication, "New Advances in Printed Circuits," issued November 22, 1948, by the National Bureau of Standards, and reference may be had thereto for a detailed description of these methods.

Ordinarily, a photo-engraving or stenciled-screen process is used, the bonded conductor consisting of a copper foil from 1 to 10 mils (.001 to .010 inch) in thickness. This copper foil is then etched. Where an aluminum foil is used, in order to prepare the surface for subsequent soldering operations, a flashing of copper is deposited on the etched aluminum surface.

It has been found desirable, and frequently essential, to first pre-tin or solder-coat the conductive surface of the printed-circuit assembly before attempting to attach electrical components thereto. Otherwise, if this preliminary solder-coating step is not performed and components are mounted to the printed-circuit assembly, in subsequent soldering operations used to attach the component leads to the printed-circuit assembly, such as dip coating, the solder tends to lump about the component terminals, wetting them in a non-uniform manner and frequently shorting across adjacent portions of the printed-circuit assembly. This problem is particularly troublesome where critical tolerances must be maintained between portions of the printed circuitry. It is, therefore, common practice where a copper-foil pattern is used that, following the etching step, in order to improve solderability and prevent oxidation of the copper foil prior to subsequent component attachment, some type of soldering-aid finish is applied. While various solder-aid finishes and techniques are known, such as solder-dipped lacquers, silver-flash immersion, and electroplating of solder, these differ in the advantages conferred by their use, differ in ease of application, and, furthermore, may differ considerably in cost. Also, not all are equally applicable to automatic mass production techniques. It has been found, for example, that while the preliminary step of electroplating of solder on the conductor may improve the solderability of the copper foil and provide a uniform coating, such a method requires an additional step, is expensive and time consuming, and considerably increases the cost of the finished printed-circuit assembly. Attempts made heretofore to apply a coating of solder on the printed-circuit assembly by a dip-coating technique have proven unsuitable, particularly for critical applications, because of the nonuniform nature of the coating obtained and the smearing of the solder owing to its tendency to flow.

It is an object of the present invention to provide a simple method for uniformly solder coating a printed-circuit assembly prior to component mounting.

It is a further object to provide a device for depositing a uniform coating of solder on a printed-circuit assembly prior to component mounting that is particularly suitable for automatic mass production techniques.

It is a feature of this invention that an automatic solder-coating technique is provided in which a dip-coating method is used in combination with resilient edge wiping to deposit a uniform coating of solder on a printed-circuit assembly.

It is a further feature that the printed-circuit sheet is cycled automatically through a preliminary fluxing bath, a molten-solder bath and a flux-removal bath, the uniform coating of solder being obtained simultaneous with the step of removing the dip-coating sheet from the solder bath.

Other objects and features of this invention and the means of attaining them will be more apparent and the invention will be more clearly understood from the following detailed description and the accompanying drawings, in which.

It should be understood that this invention is primarily concerned with the preassembly step in preparing printed circuits prior to the attachment of the electrical components to the printed-circuit-assembly sheet. This invention finds its principal utility, although not confined thereto, in depositing a thin uniform coating of solder on an etched copper strip attached to an insulating sheet. This method is intended to replace other known techniques, such as electrodeposition, heretofore used for depositing this uniform coating of solder.

Figure 1:
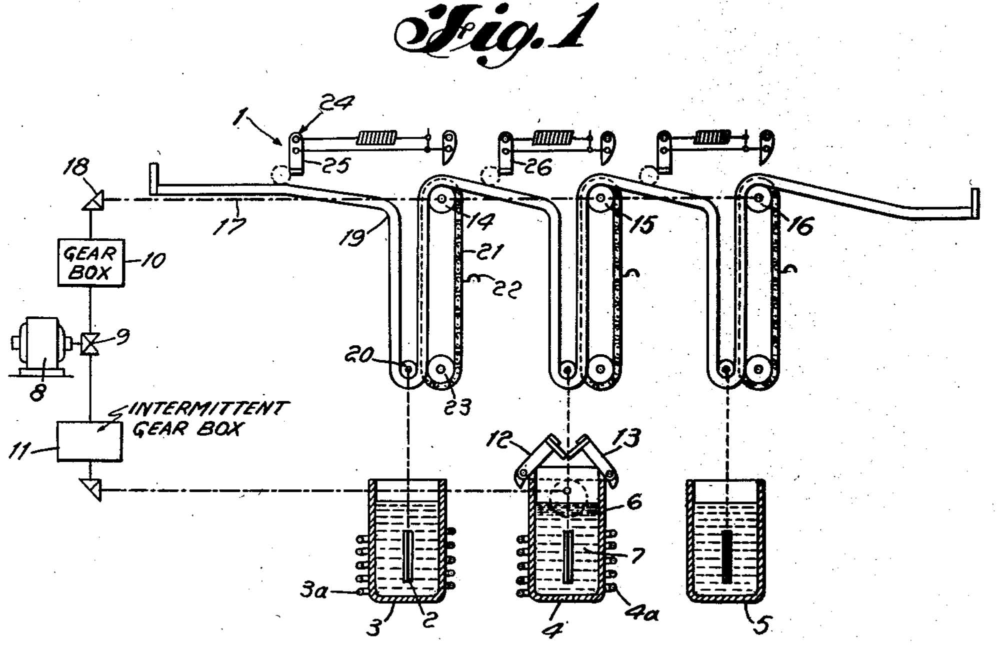
Fig. 1 is a schematic representation of the over-all solder-coating machine of this invention.

For purposes of illustration, a method of applying a uniform coating of solder will be described in conjunction with the automatic solder-coating assembly shown in Fig. 1. While the method of applying a uniform coating of solder is described in conjunction with only a single printed-circuit sheet, it will, of course, be understood that this method is intended and applicable for continuous, automatic, mass production techniques. A sequential conveyor 1 is shown for carrying the printed-circuit assembly sheet 2 into and out of each of the baths in sequence. Bath 3 consists of a fluxing bath containing any suitable fluxing agent. A molten-rosin composition is generally preferable. Resistance heater *3a* is used for maintaining the rosin in a molten state. Bath 4 contains a molten-solder composition, such as a conventional 60–40 tin-lead solder 7, preferably containing on the surface thereof a molten layer of rosin 6 to minimize surface oxidation of the molten nolder. Resistance heater 4*a* serves to maintain the solder and rosin in a molten state. Bath 5 contains an appropriate flux solvent, such as methyl alcohol or isopropyl alcohol, depending upon the particular fluxing agent used, for dissolving any of the fluxing agent remaining on the sheet 2. Conveyor 1 is set into operation by energizing motor 8 having beveled gear 9 attached to its shaft. Gear box 10 actuates the transport of the sheet from one bath to the next. The operation of intermittent gear box 11 is synchronously adjusted in relation to that of gear box 10 so that wiper arms 12 and 13 open during immersion of sheet 2 into bath 4, and engage the surfaces of sheet 2 during removal of this sheet from the bath. Sprockets 14, 15 and 16 associated with baths 3, 4 and 5, respectively, are mounted on a common shaft 17 and actuated by gear 18. Track 19 serves to guide a plurality of rollers 20 along its path from one bath to the other in sequence. The printed-circuit assembly sheets are attached to these rollers. Considering the operation of the conveyor with respect to bath 3, as shaft 17 rotates, sprocket 14 drives chain 21 until finger 22 passing idler sprocket 23 engages the spring-loaded tripping mechanism 24. This serves to release stop 25 and allows roller 20 to move along track 19 until it is positioned over bath 3. As roller 20 travels downward along the track, sheet 2 is lowered into flux bath 3. As shown in Fig. 1, roller 20 is at its minimum position. After remaining in the bath for the desired period of time, usually 30 seconds, although of course any desired timing cycle may be used, the sheet is removed from bath 3 and conveyed to bath 4 over which it is positioned. It is, of course, understood that while the movement of only a single sheet is being described, other sheets of printed-circuit assembly are being similarly conveyed and positioned over their respective baths. Sheet 2 is conveyed from bath 3 to bath 4 by operation of finger 22, which, upon traveling a second time about sprocket 23, engages roller 20 now positioned over bath 3 and raises this roller along track 19 until it is held by stop 26. In a similar manner, as described for bath 3, this roller with its attached printed-circuit sheet is guided along track 19, and the sheet is immersed into solder bath 4 in a substantially vertical position. At the same time, the operation of intermittent gear box 11 is synchronized with the immersion of sheet 2 into the bath so that wiper arms 12 and 13 are open, thereby allowing for undisturbed immersion of the sheet into the bath. The sheet passes through flux layer 6 into molten solder 7. After the sheet has remained in the solder 7 for the desired period of time, such as 30 seconds, it is withdrawn from the bath. Simultaneous with the withdrawal operation, intermittent gear box 11 by means of its associated coupling mechanism urges wiper arms 12 and 13 into the path of movement of the sheet to cause resilient-edge members 27 and 28 to engage the conductor-carrying surface of the sheet to remove surplus solder from the electric conductor and provide a smooth uniform coating of solder. Most of the surplus flux present on insulated portions of the sheet is also removed.

It is considered an essential feature of this invention that these wiper means be resilient and provide knife-edge wiping. Thereby, a thin uniform coating of solder is deposited on the copper-strip assembly without smudging or non-uniform lumping. On a mass production basis, such a technique affords considerable advantages in eliminating a critical electroplating step and at the same time depositing in a simple manner a uniform coating of solder eminently suitable for subsequent attachment of components thereto. In a similar manner as described for baths 3 and 4, the printed-circuit sheet is conveyed to bath 5, positioned thereover, and lowered into this bath for a desired period of time in order to remove any adherent flux present, and then withdrawn therefrom. A blast of hot air may be used to facilitate the evaporation of the solvent used for removing the flux.

Figure 2:
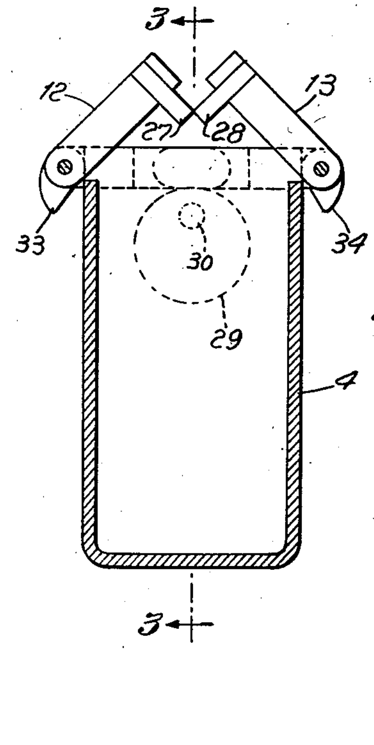
Fig. 2 is an elevational view partly in section of the solder bath with the associated wiper means.
Figure 3:
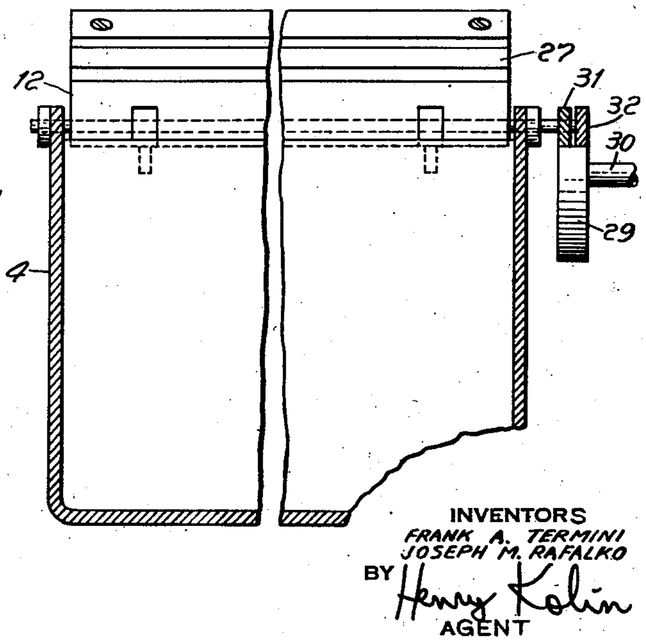
Fig. 3 is a cross-sectional view of the bath and wiper means of Fig. 2 taken along the lines 3—3 of Fig. 2.
Figure 4:
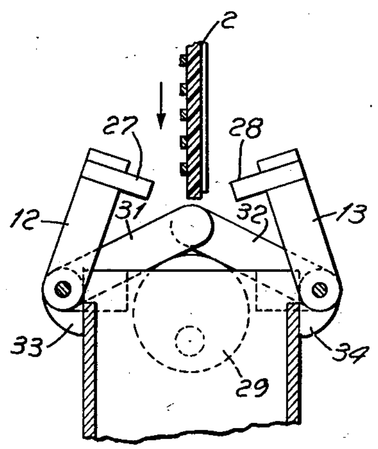
Fig. 4 is an enlarged view similar to that shown in Fig. 2 of the operation of the wiper means during the immersion of the printed-circuit sheet into the solder bath.

In Figs. 2 and 3 are illustrated enlarged detailed views of the solder bath 4 showing the method of operation of the wiper arms 12 and 13. A cam 29 is eccentrically mounted on shaft 30, and this cam serves to actuate the lever members 31 and 32 to which are attached wiper arms 12 and 13. Stops 33 and 34 control the travel of these lever members. The rotation of the cam is arranged in synchronization with the immersion of the sheet 2 into the bath so that wiper arms 12 and 13 are held open while the sheet is immersed into the bath. This immersion operation is illustrated in fuller detail in Fig. 4.

Figure 5:
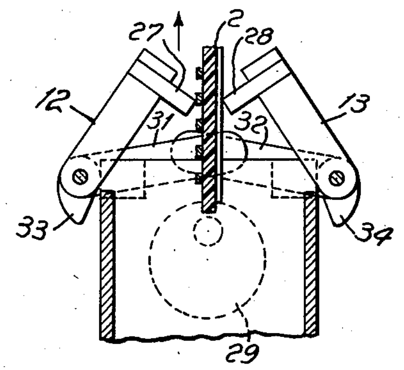
Fig. 5 is an enlarged view similar to that shown in Fig. 2 showing the operation of the wiper means during the removal of the printed-circuit sheet from the solder bath.

Upon withdrawal of the sheet from the bath, as illustrated in Fig. 5, wiper arms 12 and 13 are urged in the path of the sheet so that the resilient members 27 and 28 engage both sides of the sheet. This method is, therefore, particularly suitable where printed-circuit assemblies are disposed on both sides of the sheet so that in one simultaneous operation both such assemblies may be uniformly solder coated. Where only one surface of the sheet contains the printed-circuit assembly, the wiper-arm assembly may be modified appropriately, if so desired, so that only one wiper arm need be used, the second wiper arm being replaced by a fixed backrest.

Figures 6, 7:
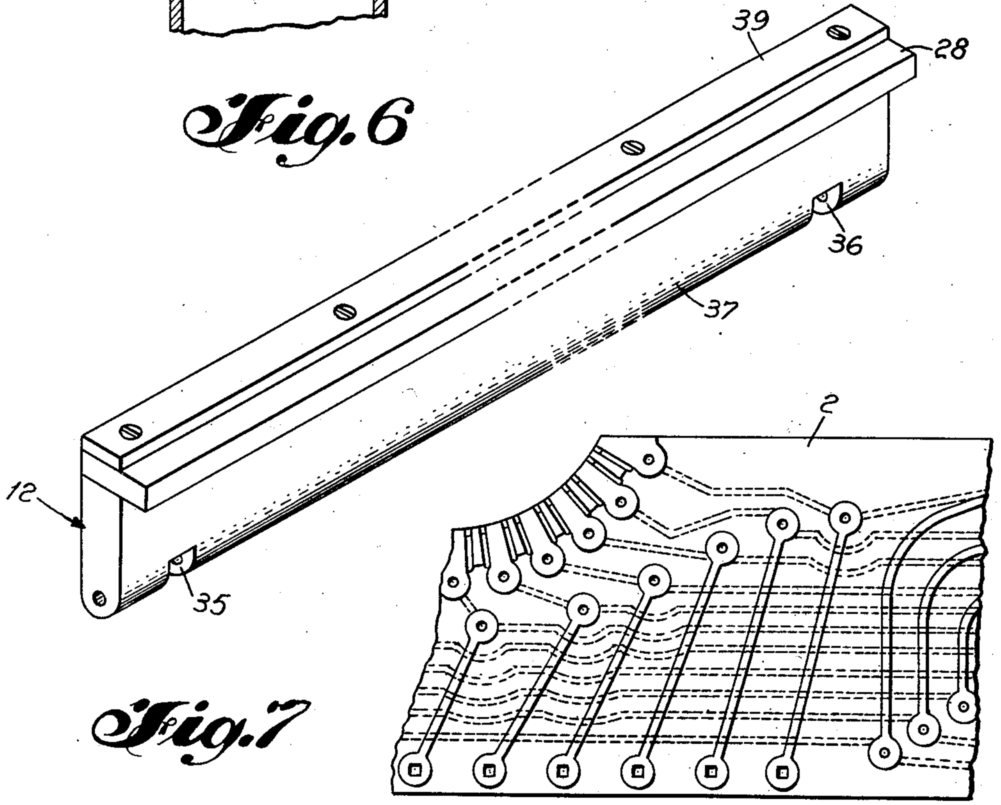
Fig. 6 is a perspective view of one of the wiper arms showing the resilient wiping blade.
Fig. 7 is a plan view of a flat-strip printed-circuit arrangement suitable for the practice of this invention.

A simple, effective type of wiper arm 12 found particularly suitable for the practice of this invention is illustrated in Fig. 6. Recesses 35 and 36 are provided in the base 37 in which stops 33 and 34 are mounted. The resilient portion 28, which provides knife-edge wiping, may be conveniently attached to the base 37 by means of a retainer bar 39. A particularly preferred material for the resilient portion 28 is silicone rubber. It has been found that the use of this material affords a particularly resilient knife-edge type of wiping action. At the same time, it is capable of withstanding the high temperatures involved in using molten solder.

In Fig. 7 is illustrated a sheet 2 of printed-circuit assembly showing an example of the type of printed-circuit assemblies that may be used for the practice of this invention. The assembly illustrated is particularly useful for purposes of automatic telephony. As illustrated, conductors are present in the form of narrow flat strips extending lengthwise of the sheet on one side to constitute a series of selector banks. A series of narrow conductive strips extends over a substantial portion of the area of the other side transverse to the sheet to constitute an electrostatic shield between the horizontal multiple of the sheet and the horizontal multiple of the next adjacent level. Such a type of printed-circuit assembly must be constructed with precision and requires that no smudging or non-uniform deposition occur, as is the case for example, when roller-wiping techniques are used. The present method of resilient-edge wiping is preferred to precisely controlled electrodeposition techniques because of its inherent simplicity. No elaborate controls are required, and a difficult additional operation is eliminated. The present method of this invention, compared with solder electrodeposition, yields equivalent and frequently improved results in a far simpler and more efficient manner, and is eminently suitable for mass production techniques.

While we have described above the principles of our invention in connection with specific apparatus and methods, it is to be clearly understood that this description is made only by way of example and not as a limitation to the scope of our invention as set forth in the objects thereof and in the accompanying claims.

We claim:

1. A device for depositing a uniform coating of solder on a printed-circuit assembly comprising a sheet of electrical insulating material carrying on at least one surface thereof an electric conductor, said device comprising, in combination, a bath containing molten solder, means for lowering said sheet into said bath of molten solder and for withdrawing said sheet from said bath, wiper means including a member having a resilient-edge portion disposed above said bath, means to position said member away from the path of movement of said sheet during lowering of said sheet into said bath, and means to urge said member into the path of movement of said sheet to cause said resilient-edge portion to engage the conductor-carrying surface of said sheet during the withdrawal of the sheet from the bath to remove surplus solder from said electric conductor.

2. A device for depositing a uniform coating of solder on a printed circuit assembly comprising a sheet of electrical insulating material carrying on at least one surface thereof an electric conductor, said device comprising a container having therein a bath of molten solder, said sheet being adapted to be lowered into said bath of molten solder and raised therefrom, wiper means including members having opposed resilient-edge portions, means pivotally supporting said members adjacent the top of said container whereby said members may be pivoted away from the path of movement of said sheet during lowering of said sheet into said bath and toward the path of movement of said sheet as it is raised from said bath, said members when pivoted toward said path of movement cause said resilient-edge portions to engage the surfaces of said sheet to remove surplus solder therefrom.

References Cited in the file of this patent

UNITED STATES PATENTS

| | | |
|---|---|---|
| 1,687,605 | Bundy | Oct. 16, 1928 |
| 2,435,766 | Baley | Feb. 10, 1948 |
| 2,671,264 | Pessel | Mar. 9, 1954 |